United States Patent
Yang

(10) Patent No.: US 12,500,582 B1
(45) Date of Patent: Dec. 16, 2025

(54) OSCILLATOR THAT PERFORMS LINEAR FREQUENCY MODULATION UPON OSCILLATION SIGNAL OUTPUT TO DC-TO-DC CONVERTER UNDER VOLTAGE MODE

(71) Applicant: Elite Semiconductor Microelectronics Technology Inc., Hsinchu (TW)

(72) Inventor: Yao-Wei Yang, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 0 days.

(21) Appl. No.: 18/743,077

(22) Filed: Jun. 13, 2024

(51) Int. Cl.
  *H03K 5/01* (2006.01)
  *H03B 5/12* (2006.01)

(52) U.S. Cl.
  CPC ............. *H03K 5/01* (2013.01); *H03B 5/1228* (2013.01)

(58) Field of Classification Search
  CPC .............................. H03K 5/01; H03B 5/1228
  USPC ....... 331/111, 143, 108 R; 363/123, 127, 50; 323/281, 273, 280, 282
  See application file for complete search history.

(56) References Cited

U.S. PATENT DOCUMENTS

| | | | |
|---|---|---|---|
| 10,256,722 B1 * | 4/2019 | Yang | ..................... H02M 3/156 |
| 11,271,479 B2 * | 3/2022 | Mei | ........................ H02M 3/156 |
| 12,191,809 B2 * | 1/2025 | Yang | .................... H03B 5/1215 |
| 2005/0285686 A1 | 12/2005 | Pettersen | |
| 2009/0102445 A1 | 4/2009 | Ito | |

* cited by examiner

*Primary Examiner* — Arnold M Kinkead
(74) *Attorney, Agent, or Firm* — Winston Hsu

(57) ABSTRACT

The oscillator includes a reference current generating circuit, a voltage modulator circuit, and an oscillating circuit. The reference current generating circuit is arranged to generate a reference current. The voltage modulator circuit is arranged to receive a feedback voltage, and perform a voltage modulation operation according to a first reference voltage and the feedback voltage, to generate a modulated voltage. The oscillating circuit is coupled to the reference current generating circuit and the voltage modulator circuit, and arranged to generate an oscillation signal with an oscillation frequency according to the reference current and the modulated voltage.

9 Claims, 3 Drawing Sheets

OSCILLATOR THAT PERFORMS LINEAR FREQUENCY MODULATION UPON OSCILLATION SIGNAL OUTPUT TO DC-TO-DC CONVERTER UNDER VOLTAGE MODE

BACKGROUND OF THE INVENTION

1. Field of the Invention

The present invention is related to frequency modulation, and more particularly, to an oscillator that can perform a linear frequency modulation upon an oscillation signal output to a direct current (DC)-to-DC converter under a voltage mode.

2. Description of the Prior Art

For a DC-to-DC converter, during an initial starting up phase, an output voltage of the DC-to-DC converter may suffer from drastic ringing problems. At this moment, the output voltage may be relatively low, which may cause an inductor current of the DC-to-DC converter to have a larger slope, and therefore make it difficult to control the inductor current at a high frequency. In addition, when an output terminal of the DC-to-DC converter is short-circuited to ground, a voltage difference between an input voltage and the output voltage may be quite large, which may also cause the inductor current to have a larger slope, and therefore cause damage to the DC-to-DC converter.

In order to address the above-mentioned issues, a frequency modulation operation may be performed upon an oscillation signal generated by an oscillator of the DC-to-DC converter, so that a current sensing operation performed upon the inductor current can effectively reflect changes of the inductor current. For a conventional method, a frequency hopping modulation operation may be performed, however, the disadvantage is that it may cause drastic changes in the output voltage and the inductor current.

SUMMARY OF THE INVENTION

It is therefore one of the objectives of the present invention to provide an oscillator that can perform a linear frequency modulation upon an oscillation signal output to a DC-to-DC converter under a voltage mode, to address the above-mentioned issues.

According to an embodiment of the present invention, an oscillator is provided. The oscillator comprises a reference current generating circuit, a voltage modulator circuit, and an oscillating circuit. The reference current generating circuit is arranged to generate a reference current. The voltage modulator circuit is arranged to receive a feedback voltage, and perform a voltage modulation operation according to a first reference voltage and the feedback voltage, to generate a modulated voltage. The oscillating circuit is coupled to the reference current generating circuit and the voltage modulator circuit, and arranged to generate an oscillation signal with an oscillation frequency according to the reference current and the modulated voltage.

One of the benefits of the present invention is that, by the oscillator of the present invention applied to a DC-to-DC converter, the overshoot/undershoot of the induction current of the DC-to-DC converter can be effectively suppressed by performing a linear frequency modulation operation. In addition, during a start-up period of a pre-biased output of the DC-to-DC converter, the changes in the output voltage of the DC-to-DC converter for the linear frequency modulation operation can be smoother than that for a frequency hopping modulation operation.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
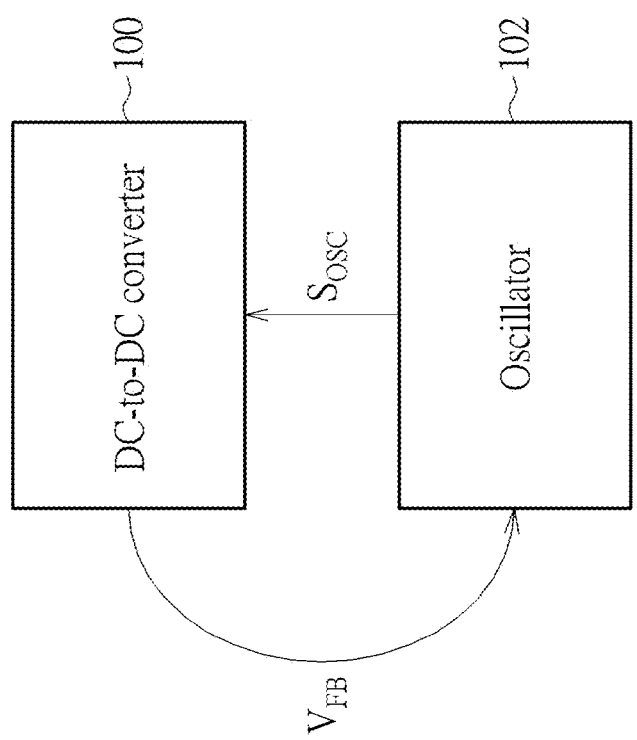
FIG. 1 is a block diagram illustrating a relationship between a DC-to-DC converter and an oscillator according to an embodiment of the present invention.

FIG. 1 is a block diagram illustrating a relationship between a DC-to-DC converter 100 and an oscillator 102 according to an embodiment of the present invention. Examples of the DC-to-DC converter 100 may include, but are not limited to: a buck converter or a boost converter. The DC-to-DC converter 100 may convert an input DC voltage into a stable output DC voltage, and provide the output voltage to a connected load (not shown in FIG. 1). The oscillator 102 may output an oscillation signal $S_{OSC}$ with an oscillation frequency $F_{OSC}$ to the DC-to-DC converter 100. In this embodiment, a feedback voltage $V_{FB}$ may be derived from the output voltage of the DC-to-DC converter 100 (e.g., may be obtained by performing a voltage division operation upon the output voltage), and the feedback voltage $V_{FB}$ may be provided to the oscillator 102 for performing a linear frequency modulation upon the oscillation frequency $F_{OSC}$ under a voltage mode.

Figure 2:
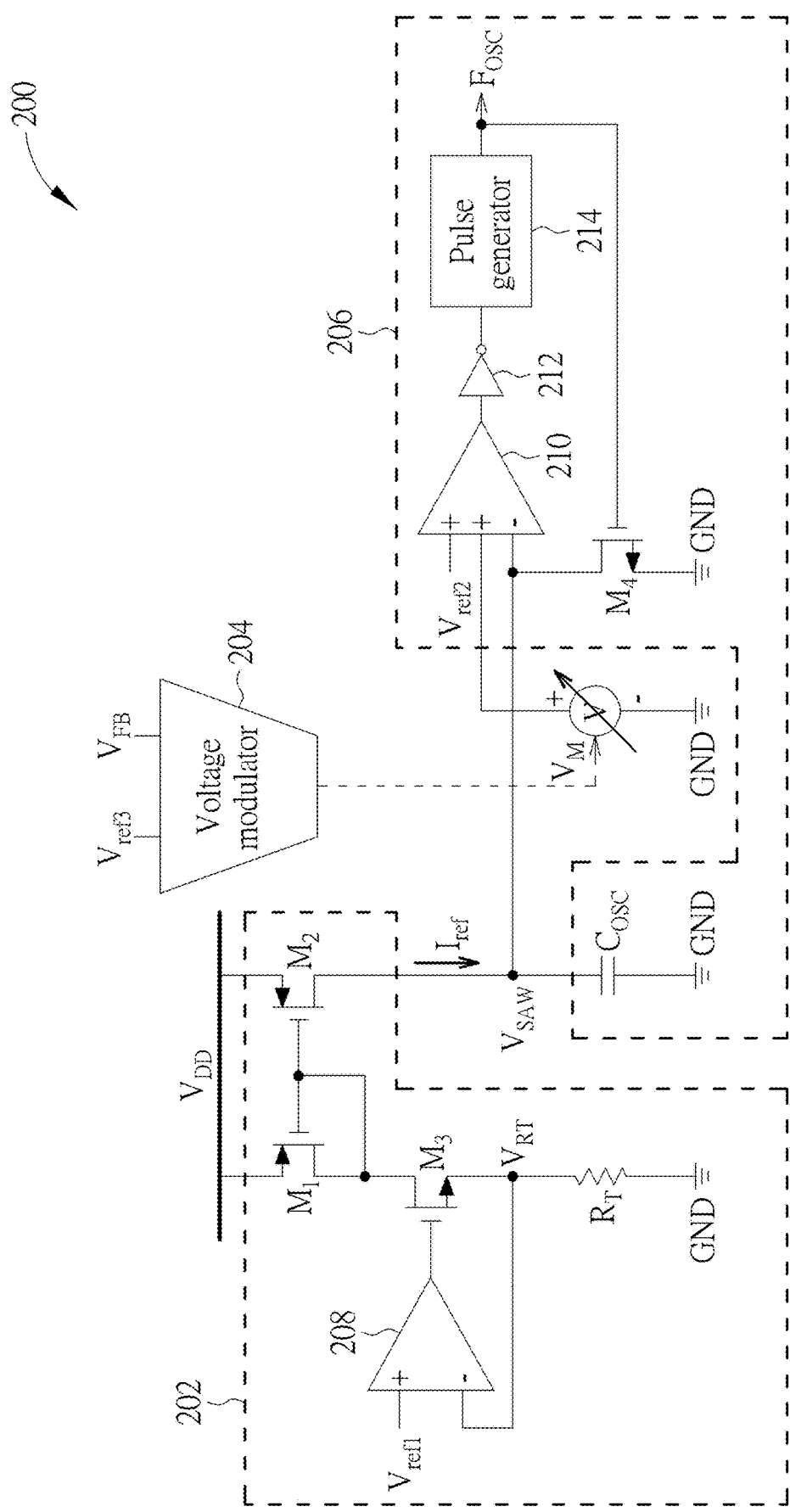
FIG. 2 is a diagram illustrating an oscillator according to an embodiment of the present invention.

In detail, refer to FIG. 2. FIG. 2 is a diagram illustrating an oscillator 200 according to an embodiment of the present invention, wherein the oscillator 102 shown in FIG. 1 may be implemented by the oscillator 200. As shown in FIG. 2, the oscillator 200 may include a reference current generating circuit 202, a voltage modulator circuit 204, and an oscillating circuit 206. The reference current generating circuit 202 may include an amplifier 208, multiple p-type transistors $M_1$ and $M_2$, an n-type transistor $M_3$, and a resistor $R_T$, wherein the p-type transistors $M_1$ and $M_2$ form a current mirror. The amplifier 208 has a non-inverting input terminal coupled to a reference voltage $V_{ref1}$ (labeled as "+" in FIG. 2), an inverting input terminal coupled to a source terminal of the n-type transistor $M_3$ (labeled as "−" in FIG. 2), and an output terminal coupled to a gate terminal of the n-type transistor $M_3$. The resistor $R_T$ has a first terminal coupled to the source terminal of the n-type transistor $M_3$ and a second terminal coupled to a grounding voltage GND. The p-type transistor $M_1$ has a source terminal coupled to a supply voltage $V_{DD}$, a drain terminal coupled to a drain terminal of the n-type transistor $M_3$, and a gate terminal coupled to the drain terminal of the p-type transistor $M_1$. The p-type transistor $M_2$ has a source terminal coupled to the supply voltage $V_{DD}$ and a gate terminal coupled to the gate terminal of the p-type transistor $M_1$. The current mirror composed of the p-type transistors $M_1$ and $M_2$ may generate a mirror current $I_{ref}$ according to a current flowing through the resistor $R_T$.

Figure 3:
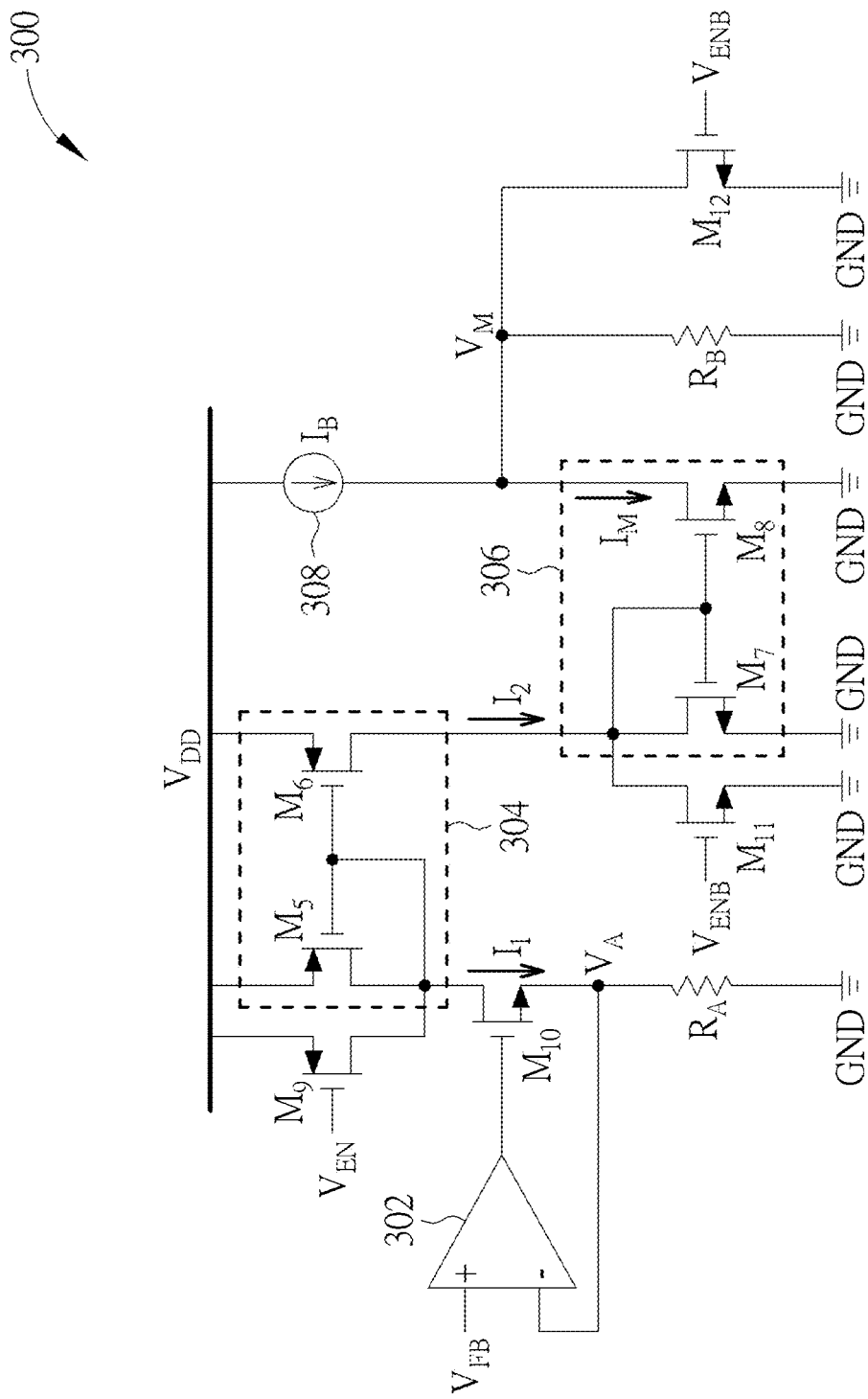
FIG. 3 is a diagram illustrating a voltage modulator circuit according to an embodiment of the present invention.

The voltage modulator circuit 204 may be arranged to receive the feedback voltage $V_{FB}$ from the DC-to-DC converter 100, and perform a voltage modulation operation according to a reference voltage $V_{ref3}$ and the feedback voltage $V_{FB}$, to generate a modulated voltage $V_M$. Specifically, refer to FIG. 3. FIG. 3 is a diagram illustrating a voltage modulator circuit 300 according to an embodiment of the present invention, wherein the voltage modulator circuit 204 shown in FIG. 2 may be implemented by the voltage modulator circuit 300. As shown in FIG. 3, the voltage modulator circuit 300 may include an amplifier 302, multiple current mirrors 304 and 306, a current source 308, multiple resistors $R_A$ and $R_B$, multiple n-type transistors $M_7$, $M_8$, $M_{10}$, $M_{11}$, and $M_{12}$, and multiple p-type transistors $M_5$, $M_6$, and $M_9$. The amplifier 302 has a non-inverting input terminal arranged to receive the feedback voltage $V_{FB}$ from the DC-to-DC converter 100 (labeled as "+" in FIG. 3), an inverting input terminal coupled to a source terminal of the n-type transistor $M_{10}$ (labeled as "−" in FIG. 3), and an output terminal coupled to a gate terminal of the n-type transistor $M_{10}$. The resistor $R_A$ has a first terminal coupled to the source terminal of the n-type transistor $M_{10}$ and a second terminal coupled to the grounding voltage GND.

The current mirror 304 may be coupled between a drain terminal of the n-type transistor $M_{10}$ and the supply voltage $V_{DD}$, and may be arranged to generate a mirror current $I_2$ according to a current $I_1$ flowing through the resistor $R_A$, wherein under a condition that a voltage value of the feedback voltage $V_{FB}$ at the non-inverting input terminal of the amplifier 302 is approximately equal to that of a voltage $V_A$ at the first terminal of the resistor $R_A$, a current value of the current $I_1$ may be derived from the equation:

$$I_1 = \frac{V_{FB}}{R_A}.$$

Specifically, the current mirror 304 may be composed of the p-type transistors $M_5$ and $M_6$. The p-type transistor $M_5$ has a source terminal coupled to the supply voltage $V_{DD}$, a drain terminal coupled to the drain terminal of the n-type transistor $M_{10}$, and a gate terminal coupled to the drain terminal of the p-type transistor $M_5$. The p-type transistor Me has a source terminal coupled to the supply voltage $V_{DD}$ and a gate terminal coupled to the gate terminal of the p-type transistor $M_5$. Assume that a ratio of a width of the p-type transistor $M_5$ over a length of the p-type transistor $M_5$ to a width of the p-type transistor $M_6$ over a length of the p-type transistor $M_6$ is 1 to k. Under this situation, a current value of the mirror current $I_2$ may be k times that of the current $I_1$ (i.e., $I_2 = k \ast I_1$).

The current mirror 306 may be coupled between a drain terminal of the p-type transistor $M_6$ and the grounding voltage GND, and may be arranged to generate a mirror current $I_M$ according to the mirror current $I_2$. Specifically, the current mirror 306 may be composed of the n-type transistors $M_7$ and $M_8$. The n-type transistor $M_7$ has a drain terminal coupled to a drain terminal of the p-type transistor $M_6$, a source terminal coupled to the grounding voltage GND, and a gate terminal coupled to the drain terminal of the n-type transistor $M_7$. The n-type transistor $M_8$ has a drain terminal coupled to the current source 308, a source terminal coupled to the grounding voltage GND, and a gate terminal coupled to the gate terminal of the n-type transistor $M_7$, wherein the modulated voltage $V_M$ is generated at the drain terminal of the n-type transistor $M_8$. Assume that a ratio of a width of the n-type transistor $M_7$ over a length of the n-type transistor $M_7$ to a width of the n-type transistor $M_8$ over a length of the n-type transistor $M_8$ is 1 to n. Under this situation, a current value of the mirror current $I_M$ may be n times that of the current $I_2$ (i.e., $$\text{i.e., } I_M = n \ast I_2 = k \ast n \ast I_1 = k \ast n \ast \frac{V_{FB}}{R_A}\Big).$$

The current source 308 may be arranged to provide a supply current $I_B$. The resistor $R_B$ has a first terminal coupled between the current source 308 and the current mirror 306, and a second terminal coupled to the grounding voltage GND, wherein the modulated voltage $V_M$ is generated at the first terminal of the resistor $R_B$. In this embodiment, a voltage value of the reference voltage $V_{ref3}$ may be preset to be equal to a product of a current value of the supply current $I_B$ and a resistance value of the resistor $R_B$ (i.e., $V_{ref3}=I_B \ast R_B$), wherein a voltage value of the reference voltage $V_{ref3}$ is greater than or equal to that of the modulated voltage $V_M$ (i.e., $V_{ref3} \geq V_M$), and a voltage value of the supply voltage $V_{DD}$ is greater than or equal to that of the reference voltage $V_{ref3}$ (i.e., $V_{DD} \geq V_{ref3}$). The voltage value of the modulated voltage $V_M$ may be equal to a product of a current value difference between the supply current $I_B$ and the mirror current $I_M$ and a resistance value of the resistor $R_B$ (i.e., $$V_M = (I_B - I_M) \ast R_B). \text{ Since } V_{ref3} = I_B \ast R_B \text{ and } I_M = k \ast n \ast \frac{V_{FB}}{R_A},$$

the voltage value of the modulated voltage $V_M$ can be derived from the equation:

$$V_M = V_{ref3} - k \ast n \ast V_{FB} \ast \frac{R_B}{R_A}.$$

In addition, each of the p-type transistor $M_9$, the n-type transistor $M_{11}$, and the n-type transistor $M_{12}$ may be regarded as a switching circuit. The p-type transistor Mg has a source terminal coupled to the supply voltage $V_{DD}$, a drain terminal coupled to the drain terminal of the p-type transistor $M_5$, and a gate terminal arranged to receive a first switching voltage $V_{EN}$. The n-type transistor $M_{11}$ has a source terminal coupled to the grounding voltage GND, a drain terminal coupled to the drain terminal of the p-type transistor $M_6$, and a gate terminal arranged to receive a second switching voltage $V_{ENB}$, wherein the second switching voltage $V_{ENB}$ is an inverse of the first switching voltage $V_{EN}$. The n-type transistor $M_{12}$ has a source terminal coupled to the grounding voltage GND, a drain terminal coupled to the first terminal of the resistor $R_B$, and a gate terminal arranged to receive the second switching voltage $V_{ENB}$. In response to the first switching voltage $V_{EN}$ being at a high level (i.e., the second switching voltage $V_{ENB}$ is at a low level), all of the p-type transistor $M_9$, the n-type transistor $M_{11}$, and the n-type transistor $M_{12}$ are turned off, and the voltage value of the modulated voltage $V_M$ may be derived by the above-mentioned equation (i.e., $$\Big(\text{i.e., } V_M = V_{ref3} - k \ast n \ast V_{FB} \ast \frac{R_B}{R_A}\Big).$$

In response to the first switching voltage $V_{EN}$ being at a low level (i.e., the second switching voltage $V_{ENB}$ is at a high level), all of the p-type transistor $M_9$, the n-type transistor $M_{11}$, and the n-type transistor $M_{12}$ are turned on, and the voltage value of the modulated voltage $V_M$ may be 0.

Refer back to FIG. 2. The oscillating circuit 206 may be coupled to the reference current generating circuit 202 and the voltage modulator circuit 204, and may be arranged to generate the oscillation signal $S_{OSC}$ with the oscillation frequency $F_{OSC}$ according to the reference current $I_{ref}$ and the modulated voltage $V_M$. In detail, the oscillating circuit 206 may include a comparator 210, an inverter 212, a pulse generator 214, an n-type transistor $M_4$, and a capacitor $C_{OSC}$. The capacitor $C_{OSC}$ has a first terminal and a second terminal, wherein the first terminal is coupled to the reference current generating circuit 202 for receiving the reference current $I_{ref}$, the second terminal is coupled to the grounding voltage GND, and a voltage $V_{SAW}$ is generated according to the reference current $I_{ref}$ and the capacitor $C_{OSC}$ at the first terminal. The comparator 210 has a first non-inverting input terminal coupled to a reference voltage $V_{ref2}$ (labeled as "+" in FIG. 2), a second non-inverting input terminal coupled to the modulated voltage $V_M$ (labeled as "+" in FIG. 2), and an inverting input terminal coupled to the first terminal of the capacitor $C_{OSC}$ for receiving the voltage $V_{SAW}$ (labeled as "−" in FIG. 2), wherein a voltage value of the modulated voltage $V_M$ is greater than or equal to that of reference voltage $V_{ref2}$ (i.e., $V_M \geq V_{ref2}$). The n-type transistor $M_4$ has a source terminal coupled to the grounding voltage GND, a drain terminal coupled to the inverting input terminal of the comparator 210, and a gate terminal coupled to an output terminal of the pulse generator 214.

The comparator 210 may be arranged to perform a comparison operation according to the reference voltage $V_{ref2}$, the modulated voltage $V_M$, and the voltage $V_{SAW}$, to generate a comparison result. The inverter 212 may be coupled to an output terminal of the comparator 210, and may be arranged to perform an inversion operation upon an output of the comparator 210 (i.e., the comparison result) to generate an inverted result. The pulse generator 214 may be arranged to generate the oscillation signal $S_{OSC}$ with the oscillation frequency $F_{OSC}$ according to the inverted result. The oscillation frequency $F_{OSC}$ may be linearly modulated through the following equation:

$$F_{OSC\_ORI} = D * F_{OSC\_MOD}$$

wherein $F_{OSC\_ORI}$ is an original oscillation frequency, $F_{OSC\_MOD}$ is a modulated oscillation frequency, D is a ratio of the modulated voltage $V_M$ to the reference voltage $V_{ref2}$ (i.e., $$\left(\text{i.e., } D = \frac{V_M}{V_{ref2}}\right),$$

and D is greater than or equal to 1 (i.e., $D \geq 1$). Since the architecture of the oscillating circuit 206 is well known to those skilled in the art, and the focus of the present invention is on the linear frequency modulation, the detailed operations of the oscillating circuit 206 are omitted here for brevity.

In summary, by the oscillator of the present invention applied to a DC-to-DC converter, the overshoot/undershoot of the induction current of the DC-to-DC converter can be effectively suppressed by performing a linear frequency modulation operation. In addition, during a start-up period of a pre-biased output of the DC-to-DC converter, the changes in the output voltage of the DC-to-DC converter for the linear frequency modulation operation can be smoother than that for a frequency hopping modulation operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An oscillator, comprising:
    a reference current generating circuit, arranged to generate a reference current;
    a voltage modulator circuit, arranged to receive a feedback voltage, and perform a voltage modulation operation according to a first reference voltage and the feedback voltage, to generate a modulated voltage; and
    an oscillating circuit, coupled to the reference current generating circuit and the voltage modulator circuit, and arranged to generate an oscillation signal with an oscillation frequency according to the reference current and the modulated voltage;
    wherein the voltage modulator circuit comprises:
        an n-type transistor;
        an amplifier, having a non-inverting input terminal arranged to receive the feedback voltage, an inverting input terminal coupled to a source terminal of the n-type transistor, and an output terminal coupled to a gate terminal of the n-type transistor;
        a first resistor, having a first terminal coupled to the source terminal of the n-type transistor and a second terminal coupled to a second reference voltage;
        a first current mirror, coupled between a drain terminal of the n-type transistor and a third reference voltage, and arranged to generate a first mirror current according to a current flowing through the first resistor, wherein a voltage value of the second reference voltage is less than a voltage value of the third reference voltage;
        a second current mirror, coupled between the first current mirror and the second reference voltage, and arranged to generate a second mirror current according to the first mirror current;
        a current source, arranged to provide a supply current; and
        a second resistor, having a first terminal coupled between the current source and the second current mirror and a second terminal coupled to the second reference voltage.

2. The oscillator of claim 1, wherein the oscillator is applied to a direct current (DC)-to-DC converter, the oscillation signal is output to the DC-to-DC converter, and the feedback voltage is from the DC-to-DC converter.

3. The oscillator of claim 1, wherein the modulated voltage is generated at the first terminal of the second resistor.

4. The oscillator of claim 1, wherein a voltage value of the first reference voltage is equal to a product of a current value of the supply current and a resistance value of the second resistor.

5. The oscillator of claim 1, wherein the first current mirror comprises:
    a first p-type transistor, having a source terminal coupled to the third reference voltage, a drain terminal coupled to the drain terminal of the n-type transistor, and a gate terminal coupled to the drain terminal of the first p-type transistor; and a second p-type transistor, having a source terminal coupled to the third reference voltage and a gate terminal coupled to the gate terminal of the first p-type transistor.

6. The oscillator of claim 5, wherein the second current mirror comprises:
a first n-type transistor, having a drain terminal coupled to a drain terminal of the second p-type transistor, a source terminal coupled to the second reference voltage, and a gate terminal coupled to the drain terminal of the first n-type transistor; and
a second n-type transistor, having a drain terminal coupled to the current source, a source terminal coupled to the second reference voltage, and a gate terminal coupled to the gate terminal of the first n-type transistor, wherein the modulated voltage is generated at the drain terminal of the second n-type transistor.

7. The oscillator of claim 1, wherein a voltage value of the first reference voltage is greater than or equal to a voltage value of the modulated voltage.

8. The oscillator of claim 1, wherein the oscillating circuit comprises:

a capacitor, having a first terminal coupled to the reference current generating circuit and a second terminal coupled to the second reference voltage;
a comparator, having a first non-inverting input terminal coupled to a fourth reference voltage, a second non-inverting input terminal coupled to the modulated voltage, and an inverting input terminal coupled to the first terminal of the capacitor;
an inverter, coupled to an output terminal of the comparator, and arranged to perform an inversion operation upon an output of the comparator to generate an inverted result;
a pulse generator, arranged to generate the oscillation signal according to the inverted result; and
an n-type transistor, having a drain terminal coupled to the inverting input terminal of the comparator, a source terminal coupled to the second reference voltage, and a gate terminal coupled to an output terminal of the pulse generator.

9. The oscillator of claim 8, wherein a voltage value of the modulated voltage is greater than or equal to a voltage value of the fourth reference voltage.

* * * * *